(12) United States Patent
Mutnury et al.

(10) Patent No.: US 12,676,582 B2
(45) Date of Patent: Jul. 7, 2026

(54) DE-SKEWING OF DIFFERENTIAL SIGNALS

(71) Applicant: Dell Products L.P., Round Rock, TX (US)

(72) Inventors: Bhyrav M. Mutnury, Austin, TX (US); Sandor T. Farkas, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 430 days.

(21) Appl. No.: 18/448,380

(22) Filed: Aug. 11, 2023

(65) Prior Publication Data

US 2025/0055430 A1 Feb. 13, 2025

(51) Int. Cl.
*H03F 3/45* (2006.01)

(52) U.S. Cl.
CPC ... *H03F 3/45475* (2013.01); *H03F 2200/129* (2013.01); *H03F 2200/165* (2013.01)

(58) Field of Classification Search
CPC ........... H03F 3/45475; H03F 2200/129; H03F 2200/165; H03F 2200/126; H03F 1/0266
USPC .................................................. 330/252–261
See application file for complete search history.

(56) References Cited

U.S. PATENT DOCUMENTS 5,796,309 A * 8/1998 Nguyen ................... H03G 7/08
330/289
7,123,098 B2 * 10/2006 Bae ........................... H03F 3/08
330/308

* cited by examiner

*Primary Examiner* — Andrea Lindgren Baltzell
*Assistant Examiner* — Khiem D Nguyen
(74) *Attorney, Agent, or Firm* — Jackson Walker L.L.P.

(57) ABSTRACT

A circuit may include a difference amplifier configured to determine a difference between a first amplitude of a first signal and a second amplitude of a second signal within a particular frequency band, an integrator configured to generate, based on the difference, a first and second bias signal, a first variable capacitor coupled to a first trace for carrying the first signal and configured to receive the first bias signal to control a first propagation speed of the first signal, the first propagation speed of the first signal corresponding to a first magnitude of the first bias signal, and a second variable capacitor coupled to a second trace for carrying the second signal and configured to receive the second bias signal to control a second propagation speed of the second signal, the second propagation speed of the second signal corresponding to a second magnitude of the second bias signal.

15 Claims, 3 Drawing Sheets

100

SYSTEM
BUS
121

120

PROCESSOR
SUBSYSTEM

MEMORY
SUBSYSTEM

130

I/O
SUBSYSTEM

140

LOCAL STORAGE
RESOURCE

150

NETWORK
INTERFACE

160

NETWORK

110

NETWORK
STORAGE
RESOURCE

170

DE-SKEWING OF DIFFERENTIAL SIGNALS

TECHNICAL FIELD

The present disclosure relates in general to information handling systems, and more particularly to methods and systems for self-describing in-situ determination of link parameters in an information handling system, including expected link health, self-tuning parameters, and speed limiting.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Due to imperfections in circuit boards, connectors and bulk cable, signals may develop skew. Skew may be defined as the difference between the positive and negative signals that make up a differential signal. Although skew may arise from transmitter, circuit board, and package imperfections, oftentimes, a majority of skew in high speed signals is from connector and cable assemblies. Such skew may arise from the basic construction of a twin axial cable in which the positive and negative component signals do not experience the same dielectric medium. The resultant skew may impact high speed signals adversely, for example resulting in common mode noise that may impact signal integrity and also impact a receiver's common mode rejection ability.

SUMMARY OF THE INVENTION

In accordance with the teachings of the present disclosure, the disadvantages and problems associated with signal skew in differential signals may be reduced or eliminated.

In accordance with embodiments of the present disclosure, a circuit may include a difference amplifier configured to determine a difference between a first amplitude of a first signal within a particular frequency band and a second amplitude of a second signal within the particular frequency band, an integrator configured to generate, based on the difference, a first bias signal and a second bias signal, a first variable capacitor coupled to a first trace for carrying the first signal and configured to receive the first bias signal to control a first propagation speed of the first signal, the first propagation speed of the first signal corresponding to a first magnitude of the first bias signal, and a second variable capacitor coupled to a second trace for carrying the second signal and configured to receive the second bias signal to control a second propagation speed of the second signal, the second propagation speed of the second signal corresponding to a second magnitude of the second bias signal.

In accordance with these and other embodiments of the present disclosure, an information handling system may include a computing component configured to process a differential signal and a circuit configured to compensate for signal skew in the differential signal. The circuit may include a difference amplifier configured to determine a difference between a first amplitude of a first signal of the differential signal within a particular frequency band and a second amplitude of a second signal of the differential signal with the particular frequency band, an integrator configured to generate, based on the difference, a first bias signal and a second bias signal, a first variable capacitor coupled to a first trace for carrying the first signal and configured to receive the first bias signal to control a first propagation speed of the first signal, the first propagation speed of the first signal corresponding to a first magnitude of the first bias signal, and a second variable capacitor coupled to a second trace for carrying the second signal and configured to receive the second bias signal to control a second propagation speed of the second signal, the second propagation speed of the second signal corresponding to a second magnitude of the second bias signal.

In accordance with these and other embodiments of the present disclosure, a method may include determining a difference between a first amplitude of a first signal within a particular frequency band and a second amplitude of a second signal within the particular frequency band, generating with an integrator, based on the difference, a first bias signal and a second bias signal, controlling a first propagation speed of the first signal with a first variable capacitor coupled to a first trace for carrying the first signal, the first propagation speed of the first signal corresponding to a first magnitude of the first bias signal, and controlling a second propagation speed of the second signal with a second variable capacitor coupled to a second trace for carrying the second signal, the second propagation speed of the second signal corresponding to a second magnitude of the second bias signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Figure 1:
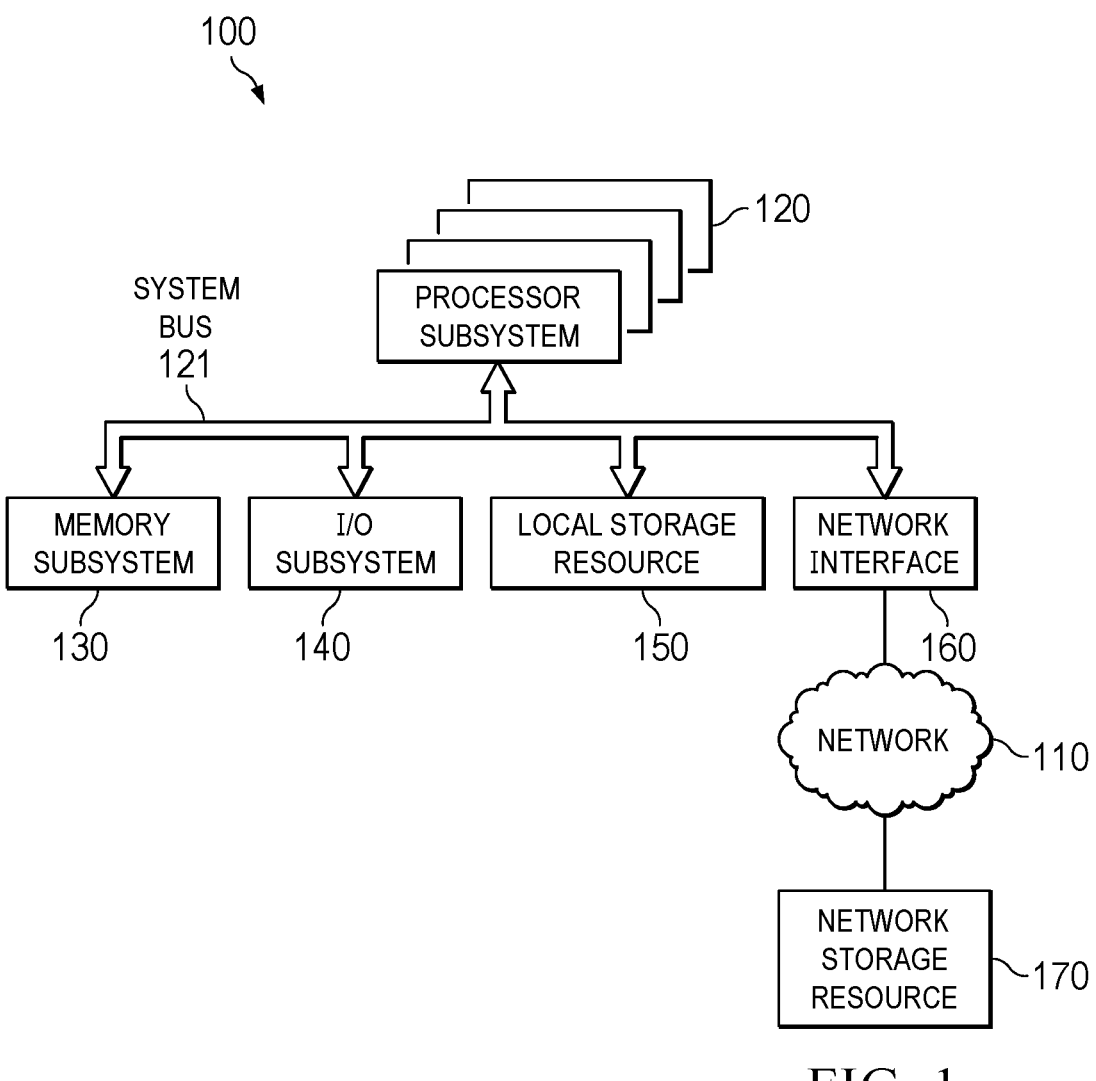
FIG. 1 illustrates a block diagram of selected components of an example information handling system, in accordance with embodiments of the present disclosure.
Figure 2:
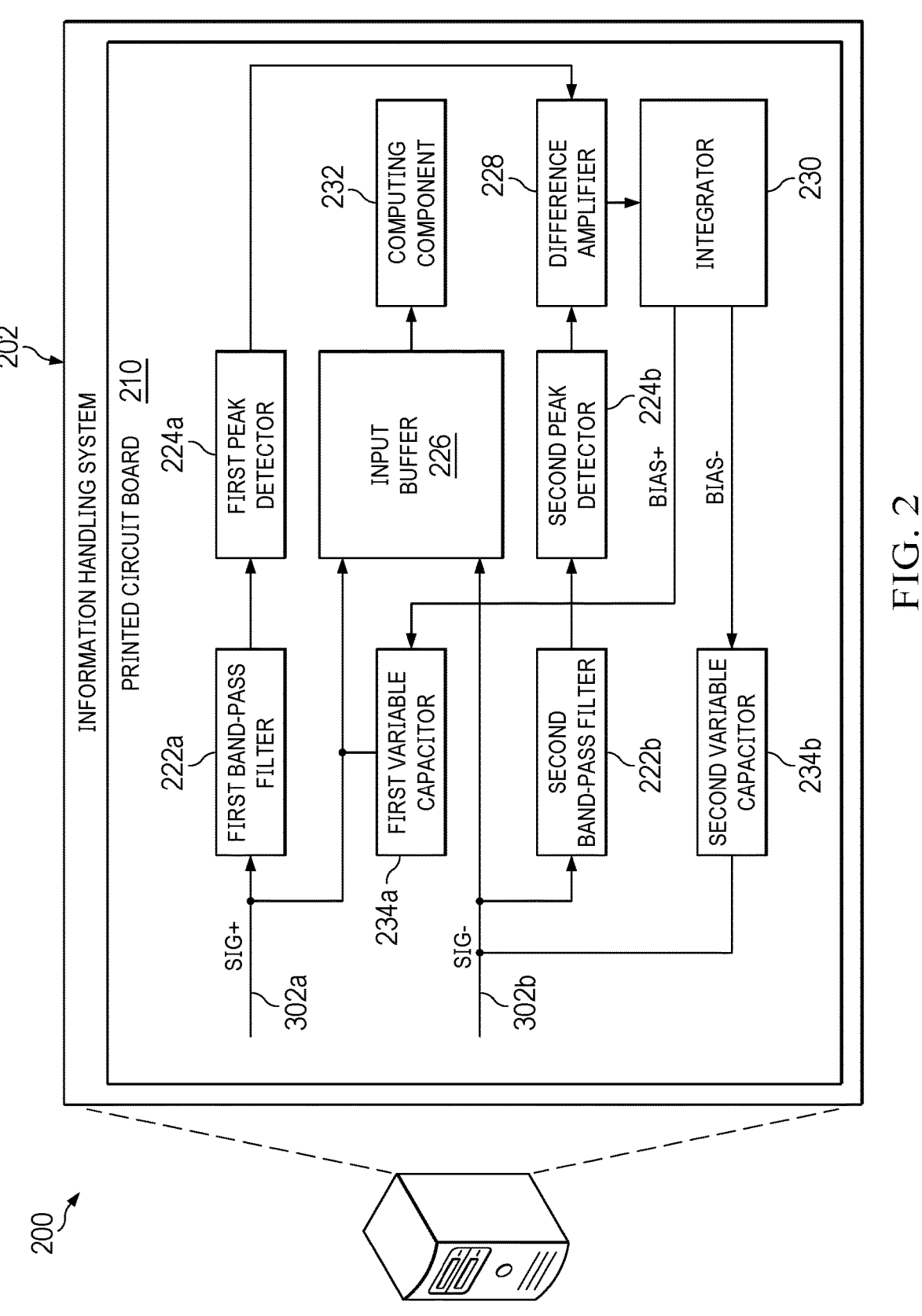
FIG. 2 illustrates a block diagram of selected components of an environment including an information handling system, in accordance with embodiments of the present disclosure.
Figure 3:
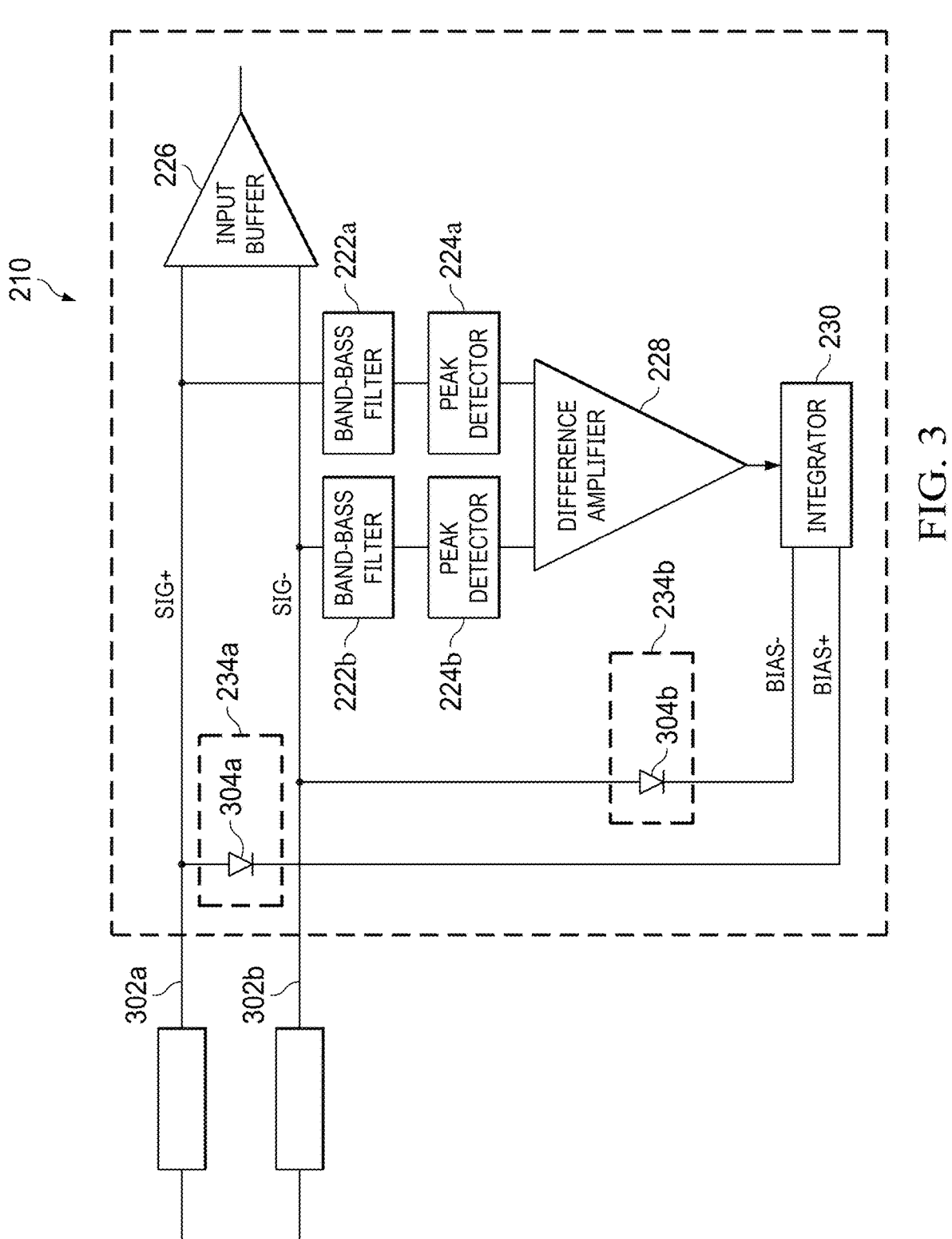
FIG. 3 illustrates selected components of an example circuit board that may be used in an information handling system, in accordance with embodiments of the present disclosure.

Preferred embodiments and their advantages are best understood by reference to FIGS. 1 through 3, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RA), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs), etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

FIG. 1 illustrates a block diagram of an example information handling system 100, in accordance with embodiments of the present disclosure. In some embodiments, information handling system 100 may comprise a personal computer. In some embodiments, information handling system 100 may comprise or be an integral part of a server. In other embodiments, information handling system 100 may comprise networking equipment for facilitating communication over a communication network. In some embodiments, information handling system 100 may comprise a storage enclosure comprising computer-readable media for storing data. In yet other embodiments, information handling system 100 may comprise a portable information handling system (e.g., a laptop, notebook, tablet, handheld, smart phone, personal digital assistant, etc.).

As shown in FIG. 1, information handling system 100 may include, but is not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Processor subsystem 120 may comprise any system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system 100). In the same or alternative embodiments, processor subsystem 120 may interpret and/or execute program instructions and/or process data stored remotely (e.g., in network storage resource 170).

Memory subsystem 130 may comprise any system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCM-CIA card, flash memory, magnetic storage, opto-magnetic storage, and/or a suitable selection and/or array of volatile or non-volatile memory that retains data after power to its associated information handling system, such as information handling system 100, is powered down.

I/O subsystem 140 may represent, for example, a variety of communication interfaces, graphics interfaces, video interfaces, user input interfaces, and/or peripheral interfaces.

In various embodiments, I/O subsystem 140 may be used to support various peripheral devices, such as a touch panel, a display adapter, a keyboard, an accelerometer, a touch pad, a gyroscope, an infrared (IR) sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

Network interface 160 may be any suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g., corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In some embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g., customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

FIG. 2 illustrates a block diagram of selected components of an environment 200 including an information handling system 202, in accordance with embodiments of the present disclosure. As shown in FIG. 2, information handling system 202 may include a printed circuit board 210. In some embodiments, information handling system 202 may be similar to, or include, information handling system 100 of FIG. 1.

As shown in FIG. 2, printed circuit board 210 may include a first band-pass filter 222a, a second band-pass filter 222b, a first peak detector 224a, a second peak detector 224b, an input buffer 226, a difference amplifier 228, an integrator 230, a computing component 232, a first variable capacitor 234a, and a second variable capacitor 234b.

A first input of input buffer 226 may receive a first polarity signal SIG+ of a differential signal along a first trace 302a. First polarity signal SIG+ may also be received by first band-pass filter 222a. First peak detector 224a may receive the output of first band-pass filter 222a, and a first input of difference amplifier 228 may receive the output of first peak detector 224a.

A second input of input buffer 226 may receive a second polarity signal SIG− of the differential signal along a second trace 302b. Second polarity signal SIG− may also be received by second band-pass filter 222b. Second peak detector 224b may receive the output of second band-pass filter 222b, and a second input of difference amplifier 228 may receive the output of second peak detector 224b.

Input buffer 226 may receive the differential signal and condition the differential signal for processing by computing component 232.

Further, integrator 230 may integrate, over time, a difference generated by difference amplifier 228, wherein such integrated difference may be indicative of accumulated skew of the differential signal. As a result, integrator 130 may generate a first bias signal BIAS+ for controlling a first variable capacitor 234a coupled to first trace 302a and a second bias signal BIAS− for controlling a second variable capacitor 234a coupled to second trace 302b.

As contemplated above, differential signals may accumulate skew as they travel through cables, connectors, and other electrically-conductive pathways. Such signal skew may reduce differential signal bandwidth, create common-mode signals components, and/or other undesirable effects. However, as described in greater detail below, variable capacitances of first variable capacitor 234a and second variable capacitor 234b may be controlled by first bias signal BIAS+ and second bias signal BIAS− in order to vary the propagation speed of first polarity signal SIG+ and second polarity signal SIG− to compensate for such skew.

FIG. 3 illustrates selected components of an example printed circuit board 210 that may be used in information handling system 100 and/or information handling system 202, in accordance with embodiments of the present disclosure.

Printed circuit board 210 may include first trace 302a and second trace 302b (which may collectively referred to as "traces 302"), which may be of differing lengths. Input buffer 226 may receive first polarity signal SIG+ and second polarity signal SIG− on first trace 302a and second trace 302b, respectively, and condition the received differential signal for use by computing component 232 for further processing.

In some instances, signal skew may cause input buffer 226 to receive first polarity signal SIG+ and second polarity signal SIG− at a delay relative to one another. Band pass filters 222, peak detectors 224, difference amplifier 228, integrator 230, and variable capacitors 234 may reduce, minimize, compensate for, and/or prevent such delay, as described further herein.

First band-pass filter 222a may be configured to select a particular frequency (e.g., the Nyquist frequency) of first polarity signal SIG+. In other words, first band-pass filter 222a may filter first polarity signal SIG+ to include only a frequency band near the particular frequency. Similarly, second band-pass filter 222b may be configured to select the particular frequency of second polarity signal SIG−. In other words, second band-pass filter 222b may filter second polarity signal SIG− to include only a frequency band near the particular frequency.

First peak detector 224a may be configured to measure a first amplitude of first polarity signal SIG+ at the particular frequency. Similarly, second peak detector 224b may be configured to measure a second amplitude of second polarity signal SIG− at the particular frequency.

Difference amplifier 228 may be configured to determine a difference between the first amplitude of first polarity signal SIG+ at the particular frequency and the second amplitude of second polarity signal SIG− at the particular frequency. A difference in the amplitudes of first polarity signal SIG+ at the particular frequency and second polarity signal SIG− at the particular frequency may be indicative of a signal skew of the differential pair of signals. For example, the difference between amplitudes of first polarity signal SIG+ and second polarity signal SIG− may be proportional to the signal skew of the differential pair of signals.

Integrator 230 may be configured to generate, based on the difference, first bias signal BIAS+ and second bias signal BIAS−. In particular, integrator 230 may generate first bias signal BIAS+ and second bias signal BIAS− based on the difference of the first amplitude and the second amplitude to adjust speed and/or timing of one or both of first polarity signal SIG+ and second polarity signal SIG-, as described further herein.

First variable capacitor 234a, shown in FIG. 3 as being implemented using a diode 304a coupled at its anode to trace 302a and coupled at its cathode to receive first bias signal BIAS+, may have a first variable capacitance that varies as a function of first bias signal BIAS+. For example, as a delay of first polarity signal SIG+ relative to second polarity signal SIG− increases, first bias signal BIAS+ may increase, decreasing the first variable capacitance and thus decreasing a propagation delay of first polarity signal SIG+. As another example, as the delay of first polarity signal SIG+ relative to second polarity signal SIG− decreases, first bias signal BIAS+ may decrease, increasing the first variable capacitance and thus increasing a propagation delay of first polarity signal SIG+.

Similarly, second variable capacitor 234b, shown in FIG. 3 as being implemented using a diode 304b coupled at its anode to trace 302b and coupled at its cathode to receive second bias signal BIAS−, may have a second variable capacitance that varies as a function of second bias signal BIAS−. For example, as a delay of second polarity signal SIG− relative to first polarity signal SIG+ increases, second bias signal BIAS− may increase, decreasing the second variable capacitance and thus decreasing a propagation delay of second polarity signal SIG−. As another example, as the delay of second polarity signal SIG− relative to first polarity signal SIG+ decreases, second bias signal BIAS− may decrease, increasing the second variable capacitance and thus increasing a propagation delay of second polarity signal SIG−.

As a result, increases and decreases to the propagation delays of first polarity signal SIG+ and second polarity signal SIG− responsive to the presence of skew may compensate for such skew. Further, the arrangement shown in FIG. 3 provides a closed feedback loop, such that the propagation delays may be continuously adjusted as described herein until equilibrium is reached—i.e., when the delay between first polarity signal SIG+ and second bias signal BIAS− reaches approximately zero.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described herein may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A circuit, comprising:
a difference amplifier configured to determine a difference between a first amplitude of a first signal within a particular frequency band and a second amplitude of a second signal within the particular frequency band;
an integrator configured to generate, based on the difference, a first bias signal and a second bias signal;
a first variable capacitor coupled to a first trace for carrying the first signal and configured to receive the first bias signal to control a first propagation speed of the first signal, the first propagation speed of the first signal corresponding to a first magnitude of the first bias signal; and
a second variable capacitor coupled to a second trace for carrying the second signal and configured to receive the second bias signal to control a second propagation speed of the second signal, the second propagation speed of the second signal corresponding to a second magnitude of the second bias signal.

2. The circuit of claim 1, wherein:
the first variable capacitor comprises a first diode anode-coupled to the first trace and cathode-coupled to a first output of the integrator that generates the first bias signal; and
the second variable capacitor comprises a second diode anode-coupled to the second trace and cathode-coupled to a second output of the integrator that generates the second bias signal.

3. The circuit of claim 1, further comprising:
a first band-pass filter configured to filter the first signal within the particular frequency band; and
a second band-pass filter configured to filter the second signal within the particular frequency band.

4. The circuit of claim 3, further comprising:
a first peak detector configured to measure the first amplitude of the first signal within the particular frequency band; and
a second peak detector configured to measure the second amplitude of the second signal within the particular frequency band.

5. The circuit of claim 1, wherein the particular frequency band is approximate to a Nyquist frequency.

6. An information handling system comprising:
a computing component configured to process a differential signal; and
a circuit configured to compensate for signal skew in the differential signal, comprising:
a difference amplifier configured to determine a difference between a first amplitude of a first signal of the differential signal within a particular frequency band and a second amplitude of a second signal of the differential signal with the particular frequency band;

10 an integrator configured to generate, based on the difference, a first bias signal and a second bias signal;
a first variable capacitor coupled to a first trace for carrying the first signal and configured to receive the first bias signal to control a first propagation speed of the first signal, the first propagation speed of the first signal corresponding to a first magnitude of the first bias signal; and
a second variable capacitor coupled to a second trace for carrying the second signal and configured to receive the second bias signal to control a second propagation speed of the second signal, the second propagation speed of the second signal corresponding to a second magnitude of the second bias signal.

7. The information handling system of claim 6, wherein:
the first variable capacitor comprises a first diode anode-coupled to the first trace and cathode-coupled to a first output of the integrator that generates the first bias signal; and
the second variable capacitor comprises a second diode anode-coupled to the second trace and cathode-coupled to a second output of the integrator that generates the second bias signal.

8. The information handling system of claim 6, further comprising:
a first band-pass filter configured to filter the first signal within the particular frequency band; and
a second band-pass filter configured to filter the second signal within the particular frequency band.

9. The information handling system of claim 8, further comprising:
a first peak detector configured to measure the first amplitude of the first signal within the particular frequency band; and
a second peak detector configured to measure the second amplitude of the second signal within the particular frequency band.

10. The information handling system of claim 6, wherein the particular frequency band is approximate to a Nyquist frequency.

11. A method comprising:
determining a difference between a first amplitude of a first signal within a particular frequency band and a second amplitude of a second signal within the particular frequency band;
generating with an integrator, based on the difference, a first bias signal and a second bias signal;
controlling a first propagation speed of the first signal with a first variable capacitor coupled to a first trace for carrying the first signal, the first propagation speed of the first signal corresponding to a first magnitude of the first bias signal; and
controlling a second propagation speed of the second signal with a second variable capacitor coupled to a second trace for carrying the second signal, the second propagation speed of the second signal corresponding to a second magnitude of the second bias signal.

12. The method of claim 11, wherein:
the first variable capacitor comprises a first diode anode-coupled to the first trace and cathode-coupled to a first output of the integrator that generates the first bias signal; and
the second variable capacitor comprises a second diode anode-coupled to the second trace and cathode-coupled to a second output of the integrator that generates the second bias signal.

13. The method of claim 11, further comprising:

filtering the first signal within the particular frequency band; and filtering the second signal within the particular frequency band.

14. The method of claim 13, further comprising:

measuring the first amplitude of the first signal within the particular frequency band with a first peak detector; and measuring the second amplitude of the second signal within the particular frequency band with a second peak detector.

15. The method of claim 11, wherein the particular frequency band is approximate to a Nyquist frequency.

\* \* \* \* \*